(12) United States Patent
Waldo

(10) Patent No.: US 6,314,023 B1
(45) Date of Patent: Nov. 6, 2001

(54) NON-VOLATILE PROGRAMMING ELEMENTS FOR REDUNDANCY AND IDENTIFICATION IN AN INTEGRATED CIRCUIT

(75) Inventor: Whitson Waldo, Hutto, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/594,504

(22) Filed: Jun. 15, 2000

(51) Int. Cl.$^7$ .................................................. G11C 16/06
(52) U.S. Cl. ............................... 365/185.09; 365/185.01; 365/185.04
(58) Field of Search ............................ 365/200, 185.09, 365/185.01, 185.04, 185.22, 189.07, 52, 63; 714/710, 711

(56) References Cited

U.S. PATENT DOCUMENTS

| | | | |
|---|---|---|---|
| 4,051,354 | * | 9/1977 | Choate .................................. 714/711 |
| 4,733,394 | * | 3/1988 | Giebel .................................. 714/711 |
| 5,284,784 | * | 2/1994 | Manley ................................. 438/263 |
| 5,682,349 | * | 10/1997 | Campardo et al. ............. 365/185.29 |
| 5,768,186 | * | 6/1998 | Ma ................................... 365/185.01 |
| 5,796,653 | * | 8/1998 | Gaultier ........................... 365/185.09 |
| 6,021,512 | * | 2/2000 | Lattimore et al. .................... 714/710 |
| 6,085,334 | * | 7/2000 | Giles et al. ................................ 714/7 |

* cited by examiner

*Primary Examiner*—David Nelms
*Assistant Examiner*—Gene N. Auduong

(57) ABSTRACT

An integrated circuit device using electrically programmable non-volatile memory cells, such as a single polysilicon having a single polysilicon level, for identifying and enabling the integrated circuit device. Such as an integrated circuit device having a memory array having rows and columns, and including redundant elements. The redundant elements include a selected one of redundant rows, redundant columns, and redundant rows and columns; and the redundant elements are selected and enabled by electrically programmable non-volatile memory cells. In another embodiment, an integrated circuit device having an electrical chip identification device including electrically programmable non-volatile memory cells. In another embodiment, an integrated circuit device having a speed and functionality tradeoff element including electrically programmable non-volatile memory cells, wherein one or more of the electrically programmable non-volatile memory cells are enabled for modifying the speed and functionality of the integrated circuit device.

10 Claims, 3 Drawing Sheets

NON-VOLATILE PROGRAMMING ELEMENTS FOR REDUNDANCY AND IDENTIFICATION IN AN INTEGRATED CIRCUIT

FIELD OF THE INVENTION

The present invention is related to the field of integrated circuits and more particularly to a mechanism and method for enabling redundancy and electrical identification using non-volatile programming elements.

RELATED ART

Semiconductor memory and microprocessor devices are typically fabricated with additional or redundant memory elements that can be selectively enabled for yield enhancement purposes. Typically, these redundant elements are enabled using conductive fuses that are selectively cut or otherwise severed with a high energy beam. Historically, such fuse elements have been implemented in polysilicon or aluminum. Processes for cutting polysilicon or aluminum are well developed.

As device speeds have increased, however, it has been necessary to replace conventional interconnect materials (i.e., aluminum) with more conductive materials, such as, for example, copper. Unfortunately, the replacement of aluminum interconnects with copper has resulted in the use of copper fuses in those devices with redundant elements. Conventional methods of cutting aluminum fuses are not typically sufficiently effective in cutting copper fuses.

It is theorized that the high energy beams that are efficient in destroying aluminum fuses may result in copper fuses that reform after the fuse disconnect operation resulting in an unwanted conductive path. This mechanism of copper re-fusing results in unreliable redundancy and electrical identification. Therefore, it would be desirable to implement a mechanism in process that would support electrical identification and redundancy, improve the efficiency of the redundancy mechanism, and without significantly increasing the size of the device (die), or the complexity of the processes to fabricate the device.

In addition, the use of metal fuses leaves exposed metal after the laser repair operation which may result in a long-term liability concern. Furthermore, copper or other metal fuse processes are typically not scalable with a reduction in process device sizes. Therefore, as a technology is reduced in size, the redundant elements occupy an increasingly large percentage of the device size. It would therefore be desirable if the implemented solution provided a scalable solution that scaled with the device technology. In addition, conventional methods of eliminating fuses may be incompatible with organic interleave dielectric because the heat generated by the fuse elimination process could undesirably alter the characteristics of the ILD.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Figure 1:
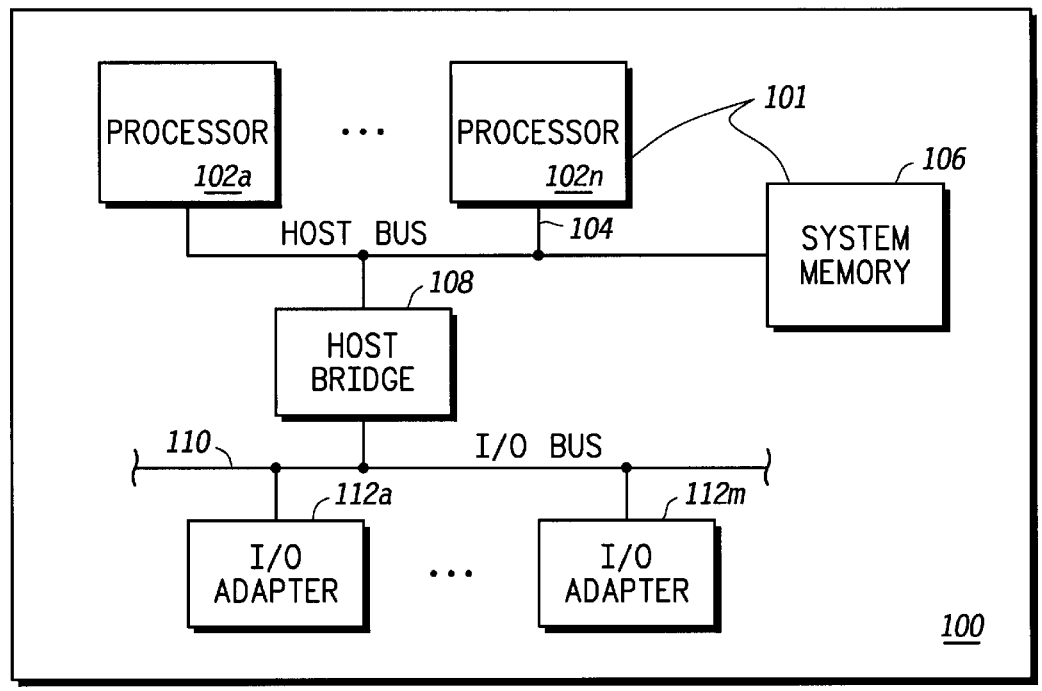
FIG. 1 is a simplified block diagram of a data processing system according to one embodiment of the present invention.

Turning now to the drawings, FIG. 1 is a simplified block diagram of a data processing system 100 according to one embodiment of the present invention. As depicted in FIG. 1, data processing system 100 includes multiple integrated circuit devices 101 including microprocessors 102a through 102n (generically or collectively referred to herein as processor(s) 102) and system memory 106. In the depicted embodiment, each processor 102 has access to system memory 106 via a host bus 104.

A host bridge 108 provides an interface between host bus 104 and an I/O bus 110. One or more IO adapters 112a through 112m (collectively or generically referred to herein as I/O adapter(s) 112). Typically I/O bus 110 is implemented with an industry standard I/O bus architecture specification such as the peripheral components interface (PCI), the industry standard architecture (ISA), the extended industry standard architecture (EISA), or other suitable I/O bus architecture. I/O adapters 112 extend the capabilities of data processing systems by providing dedicated devices for handling specific tasks thereby enabling processor 102 to focus on processor intensive operations. I/O adapters 112 may include, as examples, hard disk controllers, video and graphics adapters, audio adapters, high speed network adapters, keyboards, pointing devices, and a variety of other I/O devices.

In one embodiment, an integrated circuit 101 of data processing system 100 includes a memory array. In processors 102, for example, this memory array may comprise a level 1 (L1) cache or an on-board level 2 (L2) cache. Depending upon the implementation, the size (memory capacity) of these on-board cache memories may require a considerable area of the total area required to implement processors 102.

Figure 2:
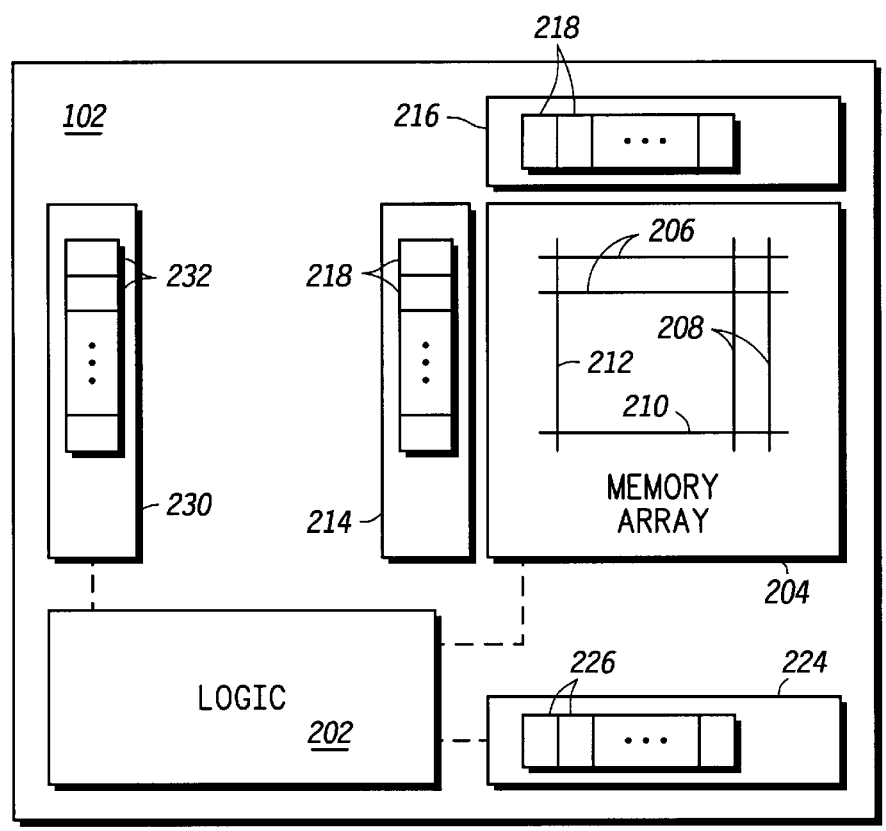
FIG. 2 is a block diagram of an integrated circuit including non-volatile redundancy elements according to one embodiment of the present invention.

Turning now to FIG. 2, a simplified block diagram of an integrated circuit incorporating redundancy enabling elements according to one embodiment of the invention is presented. In the depicted embodiment, the integrated circuit is suitable for use as processor 102 of FIG. 1. Processor 102 includes a logic portion 202 that supports the bulk of the computing done by processor 102. Logic 202 may include various functional units including load/store units, branch units, floating point units, arithmetic logic units, and other suitable functional units. In addition, logic 202 may include various registers, stacks, and other dedicated storage elements depending upon the processor implementation.

In the depicted embodiment, processor 102 includes an integrated memory array 204 that includes a set of memory rows 206 and memory columns 208 as will be appreciated by those skilled in the field of memory design. In this arrangement, each storage element of memory array 204 is characterized by a row address and a column address. Logic 202 generates an address that indicates a particular storage element in memory array 204. In the depicted embodiment, the address generated by logic 202 must pass through a row decoder 214 and a column decoder 216. As their names suggest, row and column decoders provide an interface between logic 202 and memory array 204 that translates an address generated by logic 202 into a particular row 206 and a particular column 208 and memory array 204.

Memory array 204 typically includes redundant elements such as one or more redundant rows 210, one or more redundant columns 212, or both. Redundant elements in a memory array provide a mechanism for repairing memory defects when the defects affect a relatively small portion of the array. (Although the depicted embodiment of memory array 204 includes both redundant rows and redundant columns, it will be appreciated that other embodiments may include redundant rows only or redundant columns only.)

If the memory array 204 is fully functional, the redundant rows and columns are not utilized. If, however, a single column 208 of memory array 204 is defective, a redundant column 212 can be used to replace the defective column 208 thereby making memory array 204 fully functional. When it is necessary to use a redundant row 210, redundancy enabling elements 218 are used to modify a row decoder 214 to select the redundant row 210 when the defective row 206 is addressed by logic unit 202. Similarly, redundancy enabling elements 218 in column decode 216 are used to select a redundant column 212 when a defective row 208 is addressed by logic unit 202. In this manner, a defective row or column is transparent to logic unit 202 and a fully functional substitute row or column is used to complete the memory array 204. Thus, redundancy enabling elements 218 provide a mechanism for selecting and enabling redundant elements such as redundant rows 210 and redundant columns 212 in memory array 204. In one embodiment, each of redundancy enabling elements 218 comprises an electrically programmable non-volatile memory cell.

In addition to memory array 204, the depicted embodiment of processor 102 includes an electrical chip identification (ECID) block 224 and a speed/functionality tradeoff (SFTO) block 230. The ECID block 224 provides a mechanism by which each processor 102 is assigned a unique identification number that can be read electronically after the processor 102 is packaged. The SFTO block 230 provides a debug or analysis mechanism by which specified circuit and circuit paths of processor 102 may be modified after fabrication.

In the depicted embodiment, the ECID block 224 includes a set of ID elements 226. Similarly, SFTO block 230 includes a set of SFTO elements 232. The ID elements 226 provide a mechanism for storing an electrically detectible identification number in ECID block 224. SFTO elements 232 provide a mechanism for selectively enabling alternative circuit paths in processor 102. ID elements 226 and SFTO elements 232 may each comprise electrically programmable non-volatile memory cells.

Figure 3:
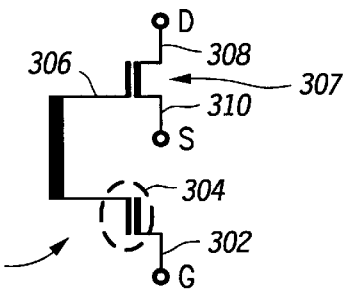
FIG. 3 is a circuit diagram of a non-volatile redundancy element suitable for use in the present invention.

Turning now to FIG. 3, a circuit diagram on one embodiment a redundancy enabling element 218 is depicted. In the depicted embodiment, redundancy enabling element 218 includes a control gate 302 that is connected to a first plate of a capacitor 304. A second plate of capacitor 304 is connected to a floating gate 306 of a transistor 307. Transistor 307 includes a drain 308 and a source 310 as will be familiar to those in the field of semiconductor fabrication. By appropriately biasing control gate 302, drain 308, and source 310, electrical charge can be transferred to floating gate 306 thereby providing a mechanism for altering the electrical characteristics of transistor 307. More particularly, if sufficient electrical charge is transferred to floating gate 306, a substantially permanent conductive path may be formed between drain 308 and source 310. Thus, the amount of charge on floating gate 306 determines the conductance of the path between drain 308 and source 310.

Figure 4A:
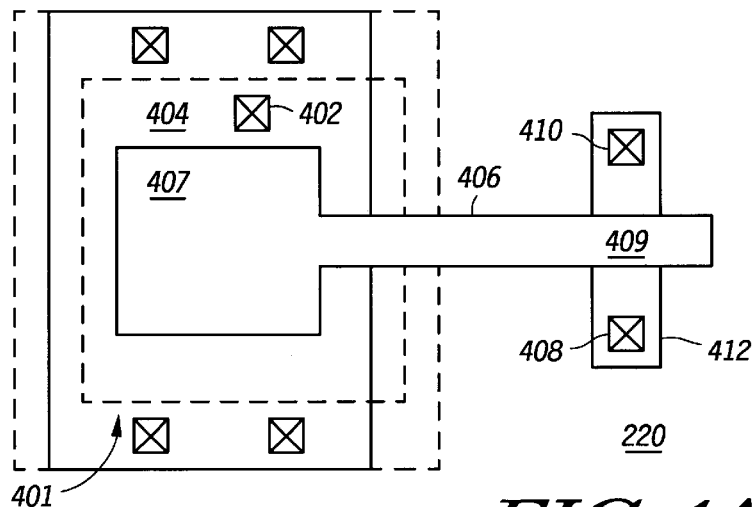
FIGS. 4A–4C are a layout view of one embodiment of the circuit of FIG. 3.

Referring to FIG. 4A, a top view of one embodiment of implementing redundancy enabling element 218 is presented. In the depicted embodiment, capacitor 304 is achieved with a polysilicon structure 406 that has a capacitor plate portion 407 and a transistor gate portion 409. Capacitor plate portion 407 of floating gate 406 defines the first plate of capacitor 304. The second plate of capacitor 304 is defined by a diffusion region 404.

In one embodiment, diffusion region 404 comprises a P+ diffusion region typically fabricated by implanting boron or other P-type dopant into a semiconductor substrate. The plate area 407 is separated from diffusion region 404 by an intervening dielectric film (not viewable in FIG. 4A). The transistor gate portion 409 of floating polygate 406 defines a transistor in conjunction with diffusion region 412.

In one embodiment, diffusion region 412 is an N+ diffusion region formed by implementing phosphorus or arsenic into a semiconductor substrate as will be familiar to those knowledgeable in the field of semiconductor fabrication. Contacts 402, 408, and 410 enable electrical contacting to diffusion region 404, and diffusion region 412 respectively.

Figure 4B:
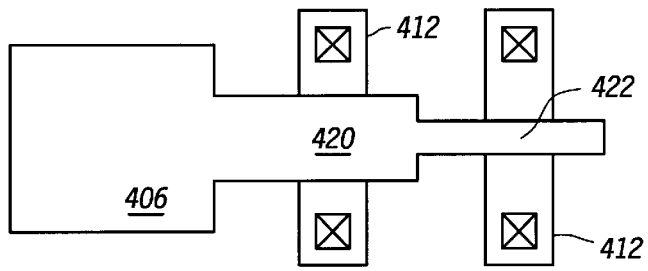

FIG. 4B shows an implementation of redundancy enabling element 218 in which floating gate 406 includes a first transistor portion 420 having a first effective transistor length and a second transistor portion 422 having a second effective length. This embodiment of floating gate 406 enables differentiation between read and write (programming) operations. The programming mechanism might, for example, rely upon the smaller effective length of second gate portion 422 while the read operation may utilize the longer effective length of first gate portion 420.

Figure 4C:
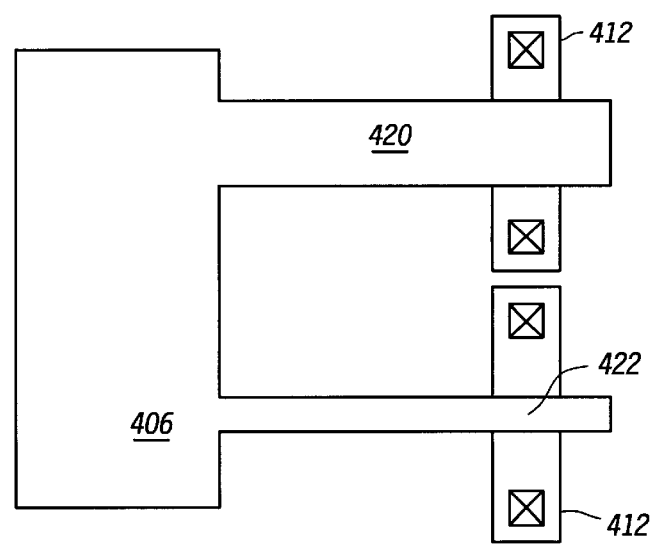

Similarly with reference to FIG. 4C, an alternative embodiment of floating gate 406 structure in which a first gate portion 420 and a second gate portion 422 are designed with different effective length to provide a separate mechanism for reading and writing redundancy enabling element 218.

Figure 5:
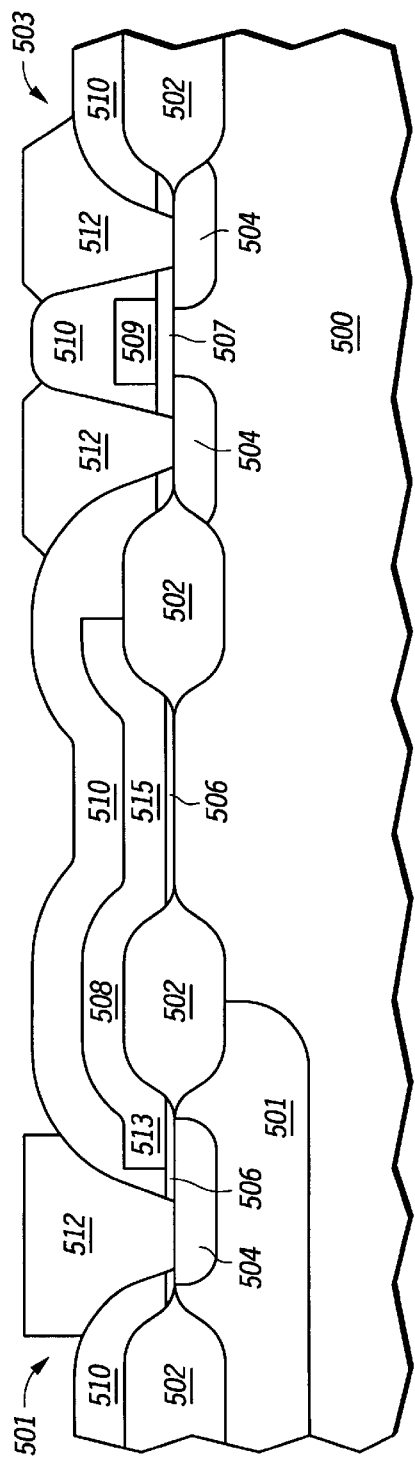
FIG. 5 is a partial cross-sectional view of the circuit of FIG. 3 according to one embodiment of the invention.

Turning now to FIG. 5, a partial cross-sectional view of integrated circuit 101 including redundancy enabling element 218 is illustrated. In the depicted embodiment, redundancy enabling element 218 is fabricated in a semiconductor substrate 500 typically comprised of single crystal silicon or other suitable semiconductor material. A well region 501 and isolation structures 502 are formed within semiconductor substrate 500 according to well known processes. Isolation structure 502 typically comprises an insulating material such as, for example, silicon dioxide or silicon nitride. In one embodiment, well region 501 is an n-well region of semiconductor substrate 500 fabricated by implanting an n-type dopant such as, for example, phosphorus or arsenic into substrate 500.

A gate oxide film 506 is formed over semiconductor substrate 500 between adjacent isolation structure 502. In the depicted embodiment, redundancy enabling element 218 is implemented with a dual thickness oxide process in which the integrated circuit includes two distinct gate oxide thicknesses.

As illustrated in FIG. 5, redundancy enabling element 218 is fabricated with a first gate oxide 506 having a first thickness. Gate oxide 506 may comprise a thermally formed silicon dioxide or any of a variety of high K dielectric materials including metal oxide materials and metal silicates. A transistor 503, on the other hand, utilizes a second gate oxide 507 where the thickness of gate oxide 507 is different than the thickness of first gate oxide 506. In one embodiment, the thinner gate oxide may be suitable for use in fabricating redundancy enabling element 218 while the thicker gate oxide represented by gate oxide 507 is used for transistors in the integrated circuit.

After formation of the gate oxide, floating gate 406 is fabricated by depositing and patterning a conductive gate layer 508. In various embodiments, conductive gate layer 508 may be implemented with heavily doped polysilicon, a silicide gate structure, or a single metal gate. A first portion 513 of gate layer 508 terminates over a portion of a diffusion region 504. Gate dielectric 506 is intermediate between first portion 513 of gate layer 508 and a heavily doped source/drain region 504. In this manner, a capacitor is formed where first gate layer 508 acts as the first plate of the capacitor and the diffusion region 504 acts as the second capacitor plate. A contact to the diffusion region 504 is made with a metal structure 512 to provide a mechanism for biasing the diffusion region (i.e., the first plate of capacitor 501).

In the cross-sectional view of FIG. 5, a second portion 515 of gate layer 508 traverses a diffusion region (non-viewable in the drawing) thereby forming a transistor that is controlled by the floating gate layer 508. Thus, the first portion 513 of gate layer 508 corresponds to the capacitor plate region 407 depicted in FIG. 4A while the second portion 515 of gate layer 508 corresponds to the transistor gate 409 of FIG. 4.

An intermediate dielectric layer 510 is indicated to provide electrical insulation between metal structure 512 and gate layer 508. Also depicted in FIG. 5, a peripheral transistor 503 is illustrated. In this description the identification of transistor 503 as a peripheral transistor is intended to indicate that peripheral transistor 503 is peripheral to the redundancy enabling blocks 218, the ECID block 224 and SFTO block 230 (as indicated in FIG. 2) of integrated circuit 102.

In the embodiment depicted in FIG. 5, peripheral transistor 503 utilizes a gate structure 509 and a gate dielectric 507. In one embodiment, the gate structure 509 of peripheral transistor 503 is fabricated simultaneously with the fabrication of gate layer 508. Gate layer 508 and gate structure 509 may each comprise polysilicon, a silicided material, or a single metal gate structure. Because gate layer 508 and gate structure 509 are fabricated simultaneously, one embodiment of the invention is said to utilize a single polysilicon process for forming both the capacitor 501 of redundancy enabling element 218 and other transistors 503 of the integrated circuit.

In addition, FIG. 5 illustrates a dual thickness oxide process in which selected transistors (including transistor 503) use a gate oxide 507 that has a thickness greater than the thickness of a gate oxide 506 elsewhere in the device.

Figure 6:
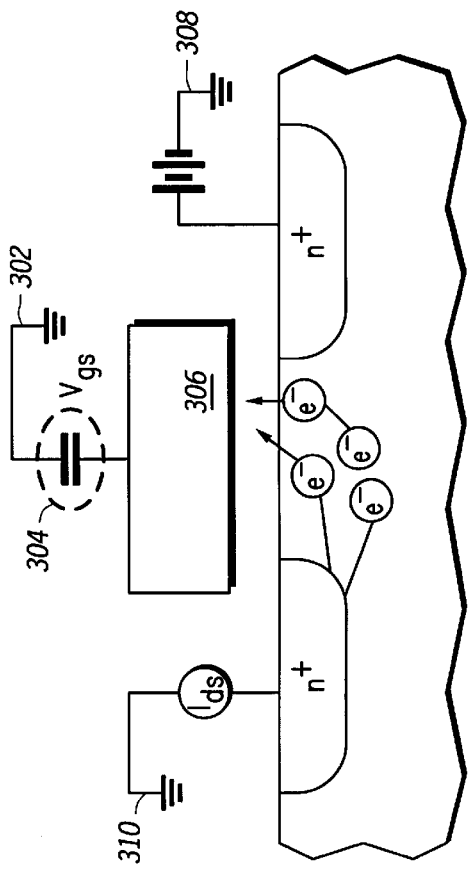
FIG. 6 is cross-sectional view illustrating programming of the non-volatile redundant element of the present invention.

Turning now to FIG. 6, an illustration of the mechanism for programming redundancy enabling element 218 is depicted. In this embodiment, the transistor 307 of redundancy enabling element 218 is an n-channel transistor. A positive DC-bias is applied to drain 308 while the source 310 and the control gate 302 are grounded. The lateral field between source 310 and drain 308 generated hot carriers that migrate towards the drain 308. The vertical electrical field in the vicinity of drain 308 results in the accumulation of electrons on the floating gate 306 thereby providing a mechanism for altering transistor 307 from a state from which a conductive path between source 308 and drain 310 exists to a state in which the path between drain 308 and source 310 is open.

Returning now to FIG. 2, the ID elements 226 of ECID block 224 and the SFTO elements 232 of SFTO block 230 can each be implemented with circuits substantially identical to redundancy enabling element 218 as described herein. Thus, in one embodiment, the invention contemplates an integrated circuit including an electrical chip identification block 224 that includes electronically programmable non-volatile memory cells as its ID element 226. In this embodiment, the ID elements 226 are selectively enabled to provide a mechanism for identifying integrated circuit 102. Similarly, another embodiment contemplates an integrated circuit that includes a speed/functionality trade-off block 230 that includes a set of electrically programmable non-volatile memory cells for its SFTO elements 232. In this embodiment, one or more of SFTO elements 232 is enabled to modify the speed or functionality of the integrated circuit device by selectively enabling or disabling predetermined circuit paths within the integrated circuit.

Thus, it will be appreciated that the integrated circuit and redundant elements described herein provide a method for repairing memory within a memory array including rows and columns in which redundant elements are incorporated within the memory array. The memory array is first tested for defective rows and columns using any of a variety of test mechanisms well known in the field of semiconductor memory device testing. After appropriate testing, it is determined whether the number of redundant elements is sufficient to repair the non-functioning rows, columns, or both. If sufficient redundant elements are available, the redundant elements are selectively enabled to select redundant elements corresponding to the defective rows and columns. Selective enabling of the redundant elements is preferably performed by programming an electrically programmable non-volatile memory cell as described previously.

To achieve integration with existing process technologies in which only a single transistor gate level is utilized, the electrically programmable non-volatile memory cells utilized as the redundant elements are implemented with a single polysilicon structure. In an analogous fashion, the ID elements 226 of ESID block 224 and the SFTO elements 232 of SFTO block 230 provide methods for identifying an integrated circuit and for modifying the speed and functionality of the integrated circuit.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. An integrated circuit device comprising:
   a memory array having rows and columns, and including a redundant element for at least one of the rows and columns; and
   wherein the redundant element is formed in a substrate and is selected and enabled by an electrically programmable non-volatile memory cell, the electrically programmable non-volatile memory cell comprising;
   a first doped region in the substrate;
   a first insulating region over a first portion of the first doped region;
   a channel region between a drain region and a source region in the substrate;
   a first conductive layer suitable for a gate of a transistor over the substrate having a first portion over the first insulating region and a second portion over the channel;
   an electrical contact to a second portion of the first doped region.

2. The integrated circuit device of claim 1, further comprising a peripheral transistor formed in the substrate having a second gate dielectric which is thicker than the first gate dielectric.

3. The integrated circuit device of claim 2, wherein the first conductive layer is a selected one of a single silicided gate structure, a single metal gate structure and single polysilicon gate structure.

4. The integrated circuit device of claim 2, wherein the first doped region is for coupling a voltage supplied by the conductive contact to the first insulating region to supply charge to the first conductive layer.

5. The integrated circuit device of claim 2, wherein the wherein the doped region is further characterized as being in a well.

6. A method for repairing memory in a memory anay having rows and columns, the method comprising:
   providing a redundant element for at least one of the rows and columns, wherein the redundant element is formed in a substrate and comprises:
   a first doped region in the substrate;
   a first insulating region over a first portion of the first doped region;
   a channel region between a drain region and a source region in the substrate;
   a first gate dielectric over the channel region;
   a first conductive layer suitable for a gate of a transistor over the substrate having a first portion over the first insulating region and a second portion over the channel;
   an electrical contact to a second portion of the first doped region; and
   testing the memory array for defective rows and columns;
   selecting the redundant element corresponding to the defective row or column; and
   enabling the selected redundant by applying a voltage to the doped region through the electrical contact.

7. The method claim 6, further comprising forming a peripheral transistor having a second gate dielectric that is thicker than the first gate dielectric.

8. The method of claim 7, wherein the first conductive layer is a selected one of a single silicided gate structure, a single metal gate structure and single polysilicon gate structure.

9. A data processing system comprising:
   a processor;
   a memory coupled to the processor, the memory including a memory array having rows and columns, and including a redundant element for at least one of the rows and columns; and
   wherein the redundant element is formed in a substrate and is selected and enabled by an electrically programmable non-volatile memory cell, the electrically programmable non-volatile memory cell comprising;
   a first doped region in the substrate;
   a first insulating region over a first portion of the first doped region;
   a channel region between a drain region and a source region in the substrate;
   a first gate dielectric over the channel;
   a first conductive layer suitable for a gate of a transistor over the substrate having a first portion over the first insulating region and a second portion over the first gate dielectric;
   a conductive contact to a second portion of the first doped region.

10. The data processing system of claim 9 further comprising a peripheral transistor formed in the substrate having a second gate dielectric which is thicker than the first gate dielectric.

* * * * *

UNITED STATES PATENT AND TRADEMARK OFFICE
CERTIFICATE OF CORRECTION

PATENT NO. : 6,314,023 B1
DATED : November 6, 2001
INVENTOR(S) : Whitson Waldo

It is certified that error appears in the above-identified patent and that said Letters Patent is hereby corrected as shown below:

Column 7,
Line 39, delete "anay" and add -- array --.

Signed and Sealed this

Third Day of September, 2002

Attest:

JAMES E. ROGAN
Attesting Officer
Director of the United States Patent and Trademark Office